United States Patent
Torres et al.

(10) Patent No.: US 11,925,903 B2
(45) Date of Patent: Mar. 12, 2024

(54) ELECTRODIALYSIS HEAT PUMP

(71) Applicant: Palo Alto Research Center Incorporated, Palo Alto, CA (US)

(72) Inventors: Francisco E. Torres, San Jose, CA (US); Eugene S. Beh, Portola Valley, CA (US); Michael Benedict, Palo Alto, CA (US)

(73) Assignee: XEROX CORPORATION, Norwalk, CT (US)

( * ) Notice: Subject to any disclaimer, the term of this patent is extended or adjusted under 35 U.S.C. 154(b) by 223 days.

(21) Appl. No.: 17/540,887

(22) Filed: Dec. 2, 2021

(65) Prior Publication Data
US 2022/0193612 A1 Jun. 23, 2022

Related U.S. Application Data

(60) Provisional application No. 63/127,604, filed on Dec. 18, 2020.

(51) Int. Cl.
*B01D 61/46* (2006.01)
*F25B 15/16* (2006.01)

(52) U.S. Cl.
CPC ............. *B01D 61/46* (2013.01); *F25B 15/16* (2013.01); *B01D 2313/365* (2013.01); *B01D 2313/50* (2013.01)

(58) Field of Classification Search
CPC ............. B01D 61/46; B01D 2313/365; B01D 2313/50; F25B 15/16; F25B 15/06
USPC .......................................................... 62/101
See application file for complete search history.

(56) References Cited

U.S. PATENT DOCUMENTS

| | | | |
|---|---|---|---|
| 2,672,024 A | 3/1954 | McGrath | |
| 4,593,534 A | 6/1986 | Bloomfield | |
| 4,984,434 A | 1/1991 | Peterson et al. | |
| 6,187,201 B1 | 2/2001 | Abe et al. | |
| 7,992,855 B2 | 8/2011 | Awano | |
| 8,142,633 B2 | 3/2012 | Batchelder et al. | |
| 8,769,972 B2 | 7/2014 | Bahar | |
| 9,340,436 B2 | 5/2016 | Sahu et al. | |
| 9,640,826 B2 | 5/2017 | Yan et al. | |

(Continued)

FOREIGN PATENT DOCUMENTS

| | | | |
|---|---|---|---|
| CN | 105308317 A * | 2/2016 | ............... F03G 7/00 |
| CN | 206055832 | 3/2017 | |

(Continued)

OTHER PUBLICATIONS

Extended European Search Report for EP 21215430.6 issued by the European Patent Office dated May 13, 2022; 7 pgs.

(Continued)

*Primary Examiner* — Steve S Tanenbaum
(74) *Attorney, Agent, or Firm* — Mueting Raasch Group

(57) ABSTRACT

A system includes an electrochemical regenerator configured to receive a first solution having a first salt concentration and output a second solution having a second salt concentration lower than the first salt concentration and a third solution having a third salt concentration higher than the first salt concentration. The first and second solutions are sent to first and second reservoirs respectively absorb and emit heat in response to a phase change of one of the solutions. The absorption or emission of heat can be used in a heat pump system.

17 Claims, 5 Drawing Sheets

(56) References Cited

U.S. PATENT DOCUMENTS

| | | | |
|---|---|---|---|
| 9,670,077 | B2 | 6/2017 | Volkel et al. |
| 9,673,472 | B2 | 6/2017 | Volkel et al. |
| 9,905,876 | B2 | 2/2018 | Schubert et al. |
| 10,211,469 | B1 | 2/2019 | Perevozchikov et al. |
| 10,782,050 | B2 | 9/2020 | Ignatiev et al. |
| 10,821,395 | B2 | 11/2020 | Beh |
| 11,015,875 | B2 | 5/2021 | Benedict et al. |
| 2005/0183956 | A1 | 8/2005 | Katefidis |
| 2020/0033032 | A1 | 1/2020 | Ignatiev et al. |
| 2020/0070094 | A1 | 3/2020 | Hussaini et al. |

FOREIGN PATENT DOCUMENTS

| | | |
|---|---|---|
| CN | 108187459 | 6/2018 |
| KR | 20150034545 | 4/2015 |
| WO | 2014/181898 | 11/2014 |
| WO | 2018/032003 | 2/2018 |
| WO | 2018/119280 | 6/2018 |

OTHER PUBLICATIONS

"Lazard's Levelized Cost of Storage—Version 2.0." 2016, 46 pages.

Al-Jubainawi et al., "Factors governing mass transfer during membrane electrodialysis regeneration of LiCl solution for liquid desiccant dehumidification systems", Sustainable Cities and Society, vol. 28, Aug. 26, 2016.

Al-Karaghouli et al., "Energy consumption and water production cost of conventional and renewable-energy-powered desalination processes", Renewable and Sustainable Energy Reviews 2013, 24, 343-356.

Anderson et al., Capacitive deionization as an electrochemical means of saving energy and delivering clean water. Comparison to present desalination practices: Will it compete?:, Electrochimica Acta 2010, 55 (12), 3845-3856.

Arellano et al., "Effects of pH on the degradation of aqueous ferricyanide by photolysis and photocatalysis under solar radiation", Solar Energy Materials and Solar Cells 2010, 94 (2), 327-332.

Ashrae Standard, "Method of Testing for Rating Desiccant Dehumidifiers Utilizing Heat for the Regeneration Process", 2007.

Beh et al., "A Neutral pH Aqueous Organic-Organometallic Redox Flow Battery with Extremely High Capacity Retention" ACS Energy Lett, 2017, 2, pp. 639-644.

Beh et al., U.S. Appl. No. 16/200,309, filed Nov. 26, 2018.

Beh et al., U.S. Appl. No. 16/378,769, filed Apr. 9, 2019.

Benedict et al., U.S. Appl. No. 16/200,376, filed Nov. 26, 2018.

Benedict et al., U.S. Appl. No. 16/386,389, filed Apr. 17, 2019.

BTMAP-VI et al., "Ordering and Customer Service Neutral pH Aqueous Redox Flow Battery Materials", Jan. 1, 2017, pp. 639.

Desai et al., "Electrochemical Desalination of Seawater and Hypersaline Brines with Coupled Electricity Storage", ACS Energy Lett. 3, 2, 2018, pp. 375-379.

Desalination Experts Group, "Desalination in the GCC", 2014, 47 pages.

Dipaola, "Saudi Arabia Gets Cheapest Bids for Solar Power in Auction" Bloomberg, Jan. 16, 2018, 3 pages.

Gong et al., "A zinc-iron redox-flow battery under $100 per kW h of system capital cost", Energy & Environmental Science, 2015. 5 pages.

Gong et al., All-Soluble All-Iron Aqueous Redox-Flow Battery, ACS Energy Letters, 2016, 1, pp. 89-93.

Hilbert et al., "Correlations between the Kinetics of Electrolytic Dissolution and Deposition of Iron: I . The Anodic Dissolution of Iron", Journal of The Electrochemical Society 1971, 118 (12), 1919-1926.

Howell et al., "Overview of the DOE VTO Advanced Battery R&D Program", Jun. 6, 2016 24 pages.

Hu et al, "Long-Cycling Aqueous Organic Redox Flow Battery (AORFB) toward Sustainable and Safe Energy Storage", Journal of the American Chemical Society 2017, 139 (3), 1207-1214.

Khawaji et al., "Advances in seawater desalination technologies", Desalination 2008, 221 (1-3), 47-69.

Kozubal et al., "Low-Flow Liquid Desiccant Air-Conditioning: Demonstrated Performance and Cost Implications" NREL Technical Report, Sep. 2014, 104 pages.

Lee et al., "Desalination of a thermal power plant wastewater by membrane capacitive deionization", Desalination 196, 2006, pp. 125-134.

Logan et al, "Membrane-based processes for sustainable power generation using water", Nature 2012, 488, 313.

Malhotra et al., "Use cases for stationary battery technologies: A review of the literature and existing projects", Renewable and Sustainable Energy Reviews 56, 2016, pp. 705-721.

McGovern et al., "On the cost of electrodialysis for the desalination of high salinity feeds", Applied Energy 136, Dec. 2014, pp. 649-661.

Moore et al., "Evaporation from Brine Solutions Under Controlled Laboratory Conditions; Report 77 for the Texas Water Development Board", May 1968, 77 pages.

Oren, "Capacitive deionization (CDI) for desalination and water treatment—past, present and future (a review)", Desalination 2008, 228 (1-3), 10-29.

Sata, "Application of Ion Exchange Membranes. In Ion Exchange Membranes: Preparation, Characterization, Modification and Application", The Royal Society of Chemistry: Cambridge, 2004.

Schaetzle et al., "Salinity Gradient Energy: Current State and New Trends", Engineering, vol. 1, Issue 2, Jun. 2016, pp. 164-166.

Scialdone et al., "Investigation of electrode material—redox couple systems for reverse electrodialysis processes—Part II: Experiments in a stack with 10-50 ce", Journal of Electroanalystical Chemistry, vol. 704, Jun. 14, 2013, pp. 1-9.

Scialdone et al., "Investigation of electrode material—Redox couple systems for reverse electrodialysis processes. Part I: Iron redox couples", Journal of Electroanalytical Chemistry 2012, 681 (Supplement C), 66-75.

Urban, "Emerging Scientific and Engineering Opportunities within the Water-Energy Nexus", Joule, Dec. 20, 2017, pp. 665-688.

US Dept. of Energy, "Desiccant Enhanced Evaporative Air-Conditioning (DEVap): Evaluation of a New Concept in Ultra Efficient Air Conditioning", Technical Report NREL/TP-5500-49722, 2011.

US Dept. of Energy, "Energy Savings Potential and RD&D Opportunities for Commercial Building HVAC Systems", Dec. 2017, 172 pages.

US Dept. of Interior/US Geological Survey, Estimated Use of Water in the United States in 2010, 2014, 64 pages.

Vermaas et al., "High Efficiency in Energy Generation from Salinity Gradients with Reverse Electrodialysis", ACS Sustainable Chem. Eng. 1, 2013, pp. 1295-1302.

Viswanathan et al., "Cost and performance model for redox flow batteries", Journal of Power Sources, vol. 247, Dec. 23, 2012, pp. 1040-1051.

Woods, "Membrane processes for heating, ventilation, and air conditioning", Renewable and Sustainable Energy Reviews, vol. 33, 2014, pp. 290-304.

Wu et al., "Kinetic study on regeneration of Fe(II)EDTA in the wet process of NO removal", Chemical Engineering Journal 2008, 140 (1), 130-135.

Yang et al., "A Natural Driven Membrane Process for Brackish and Wastewater Treatment: Photovoltaic Powered ED and FO Hybrid System", Environmental Science and Technology, Sep. 4, 2013, pp. 10548-10555.

\* cited by examiner

ELECTRODIALYSIS HEAT PUMP

RELATED PATENT DOCUMENTS

This application claims the benefit of U.S. Provisional Application No. 63/127,604, filed on Dec. 18, 2020 which is incorporated herein by reference in its entirety.

TECHNICAL FIELD

This disclosure relates generally to heat pumps that utilize electrochemical regeneration of a liquid desiccant to drive one or more heat pumps.

BACKGROUND

Vapor compression (VC) driven heat pump water heaters (HPWH) are currently in use. They typically have a reported coefficient of performance (COP) of 3-4, while conventional water heaters have a COP of about 1, or less. Conventional VC driven water heaters cannot take advantage of the "glide" during ramping of water temperature, and they use high global warming potential (GWP) refrigerants. Most water heaters can achieve some degree of demand shift by thermal storage of hot water and may further enable demand shift by using higher water temperatures and mixing valves. However, such thermal storage suffers from inherent thermal losses as heat transfers from hot water to the ambient, and such thermal storage is not well suited for load sharing amongst different heat pumps, which may be doing different jobs.

SUMMARY

Embodiments described herein are directed to a heat pump system using an electrodialysis apparatus. In one embodiment, a system includes an electrochemical regenerator configured to receive a first solution having a first salt concentration. The electrochemical regenerator outputs a second solution having a second salt concentration lower than the first salt concentration and a third solution having a third salt concentration higher than the first salt concentration. The system includes a first reservoir with first contents having a first water vapor pressure and configured to receive the second solution and output a vapor stream and a residual stream. The first reservoir absorbs a heat. The system includes a second reservoir with second contents having a second water vapor pressure that is less than the first water vapor pressure and coupled to the first reservoir. The second reservoir is configured to receive the third solution, the vapor stream and the residual stream. The second reservoir outputs heat and a recombined solution having a fourth salt concentration, wherein the recombined solution is recirculated to the electrochemical regenerator. In some embodiments, the system includes a secondary heat pump to circulate a working fluid that is cooled by the first heat flux or heated by the second heat flux through a heat exchanger. Alternatively, heat can be exchanged directly with the first and/or second reservoir to form a heat pump system.

The above summary is not intended to describe each disclosed embodiment or every implementation of the present disclosure. The figures and the detailed description below more particularly exemplify illustrative embodiments.

BRIEF DESCRIPTION OF THE DRAWINGS

The discussion below refers to the following figures, wherein the same reference number may be used to identify the similar/same component in multiple figures. However, the use of a number to refer to a component in a given figure is not intended to limit the component in another figure labeled with the same number. The figures are not necessarily to scale.

DETAILED DESCRIPTION

Figure 1:
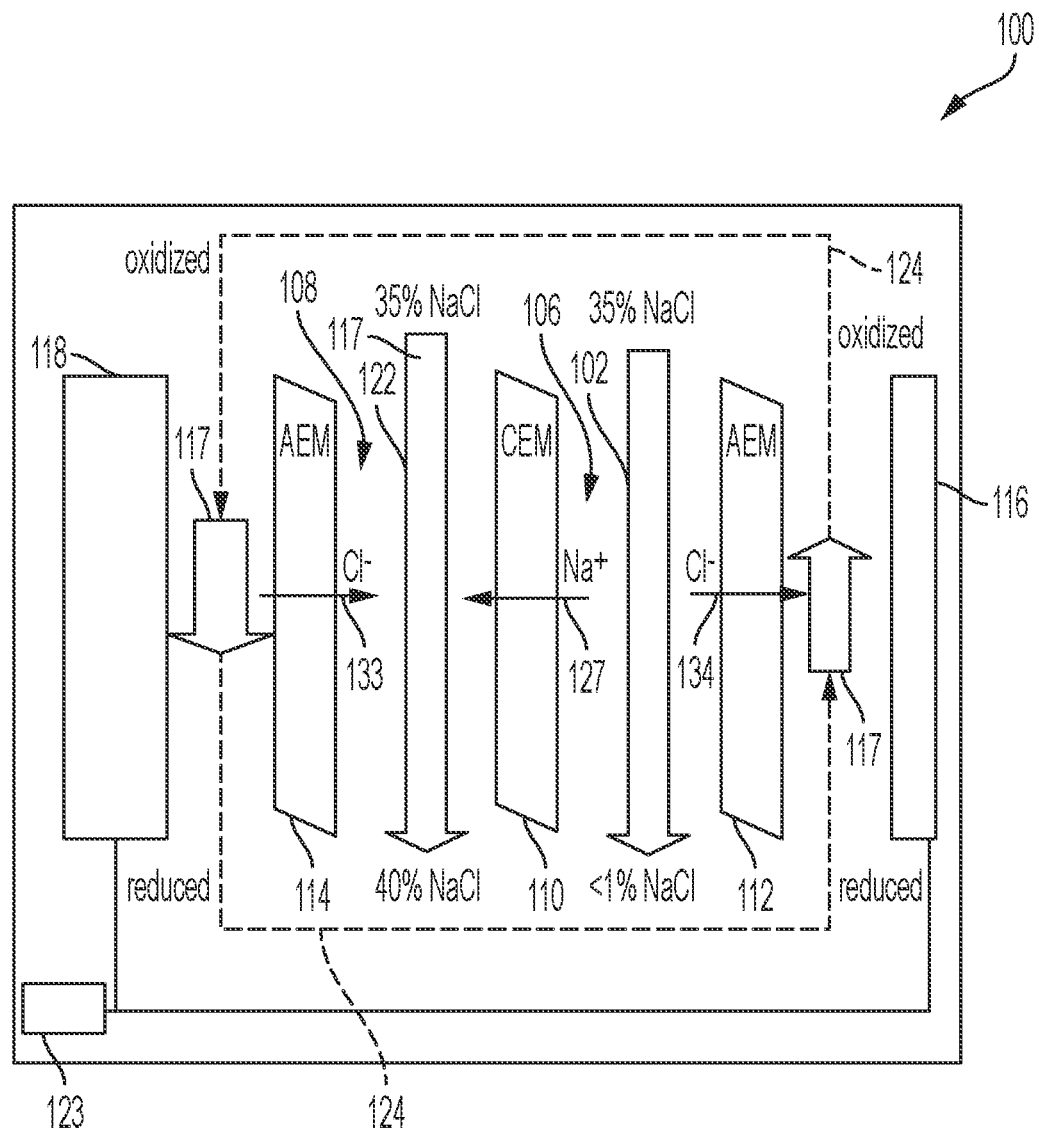
FIG. 1 is a diagram of a redox flow electrochemical regenerator stack and system according to an example embodiment.

Absorption heat pumps use heat to generate a phase change. There has been work on thermally driven HPWHs with demonstrated COPs greater than 1. Since the residential water heater market is roughly half electric and half gas, the ongoing work on thermally driven HPWHs may be used to develop similar components for alternatively driven heat pumps. Described herein are heat pumps driven by electrochemical regeneration of a liquid desiccant that can take advantage of the "glide" during water temperature ramping. These heat pumps do not necessarily use heat to generate a phase change and are entirely electric.

The systems described below can be used as a heat pump to move heat energy for a number of applications, such as heating, ventilation and air-conditioning (HVAC), water heating, industrial processing, etc. Generally, a heat pump is a system that utilizes a heat transfer medium (e.g., gas or liquid) to move heat in a direction opposite that of spontaneous heat transfer. Well-known heat pump systems include vapor-compression cycle machines used in refrigerators and air-conditioning. Another type of heat pump includes vapor absorption systems where a liquid refrigerant evaporates in a low partial pressure environment, absorbing heat from its surrounding.

Another type of heat pump is known as a ground source heat pump, which makes use of a thermal sink, such as a heat exchanger buried deep in the ground, placed in a large body of water, etc. The thermal sink stays at or near a relatively constant temperature $T_c$ and can act as a sink or a source of thermal energy. When the ambient temperature is above $T_c$, heat can be transferred from the target environment (e.g., a building) to the thermal sink. When the ambient temperature is below $T_c$, heat can be transferred from the thermal sink to the target environment.

Some embodiments are described as outputting a heat flux $Q_{out}$ of a heat pump and absorbing a heat flux $Q_{in}$ of the heat pump. Note that the term "heat flux" here refers to a transfer of thermodynamic energy from one mass to another mass, and may use any combination of heat transfer modes, e.g., convection, conduction, and radiation. In some embodiments, the heat exchange for heat emission and absorption takes place directly with the above first and second reservoirs. In other embodiments, a secondary heat pump may be used to transfer heat to and from the reservoirs.

In embodiments described below, a high-COP, non-VC heat pump is described that reduces water heater energy consumption below the state of the art. With U.S. residential storage water heaters forecasted to consume 2.8 Quads of primary energy and thereby be responsible for 135 Mt of $CO_2$ emissions in 2020, and commercial water heating consuming another 0.7 Quads, the described technology makes a meaningful impact on increasing energy efficiency.

The heat pump leverages Shuttle-Promoted Electrolyte Removal (SUPER), a membrane electrodialysis process to separate salt solutions into distinct concentrated and dilute streams, then recombine the streams to release their differential energy and create the heat pump effect. SUPER is energy efficient: it uses a recirculating redox reagent that keeps electrode overpotentials close to zero and does not require water splitting to complete the circuit. Applying SUPER technology to the design of a heat pump provides second law of thermodynamics efficiencies better than state-of-the-art VC, providing both energy and operating cost savings. The described heat pump systems can store energy in the form of the separated salt solutions indefinitely and at low cost, providing demand-shift capability for this class of heat pump. The stored energy can be used by other SUPER heat pumps performing different tasks, such as heating and cooling for HVAC, by connecting multiple heat pumps to the same salt solution storage.

In FIG. 1, a diagram shows a SUPER cell 100 according to an example embodiment. The cell 100 includes two electrodes 116, 118, at least three ion exchange membranes 110, 112, 114, and an energy supply 123. The first electrode 116 contacts a solution of a redox-active electrolyte material and is configured to have a first reversible redox reaction with the redox-active electrolyte material. The second electrode 118 contacts the redox-active electrolyte material in a second location and is configured to have a second reversible redox reaction with the redox-active electrolyte material that reverses the redox reaction performed at the first electrode. For purposes of simplicity, the redox-active electrolyte solutions are shown in the FIG. 1 as a single redox shuttle solution 117 comprising the redox-active electrolyte material.

Examples of a redox shuttle solution include 1,1'-bis((3-trimethylammonio)propyl)ferrocene ([BTMAP-Fc]$^{2+}$) and 1,1'-bis((3-trimethylammonio)propyl)ferrocenium ([BTMAP-Fc]$^{3+}$), or 1,1'-bis((3-dimethylethylammonio)propyl)ferrocene ([BDMEAP-Fc]$^{2+}$) and 1,1'-bis((3-dimethylethylammonio)propyl)ferrocenium ([BDMEAP-Fc]$^{3+}$), which are non-toxic, highly stable, ferrocene derivatives that have very rapid electrochemical kinetics and negligible membrane permeability, or ferrocyanide/ferricyanide ([Fe(CN)$_6$]$^{4-}$/[Fe(CN)$_6$]$^{3-}$). Additional details for example redox shuttle solutions can be found in commonly-owned U.S. patent application Ser. No. 17/390,600, filed Jul. 30, 2021, which is hereby incorporated by reference in its entirety.

The redox shuttle 117 is circulated between the two electrodes 116, 118 as shown by loop 124. When an electrical potential is applied to each electrode 116, 118 by energy supply 123, the redox shuttle is oxidized at a first electrode (e.g., 116) and reduced at the opposite electrode (e.g., 118). The energy supply 123 may be any variety of direct current (DC) energy supply such as a battery, photovoltaic panel, galvanic cell, potentiostat, AC/DC power converter, etc. The electrical polarity from the energy supply 123 may be kept the same throughout or periodically reversed. The energy supply 123 may be contained within the electrochemical cell 100 or be external and coupled to the cell 100. Thus, as the shuttle 117 circulates between the electrodes, the portions of the shuttle 117 are continuously alternating between the redox states. In certain embodiments, each electrode 116, 118 may contact separate redox-active solutions instead of the same redox shuttle solution 117 being flowed in a loop. The separate redox-active solutions may have the same redox-active electrolyte material or different redox-active electrolyte materials. When different redox-active solutions are used for the respective electrodes 116, 118, the energy supply may periodically reverse the potential supplied to the electrodes to restore the state of charge (e.g., the proportion of redox-active electrolyte material in each solution that is in the oxidized state compared to the reduced state) of each of the redox-active electrolyte material solutions.

Positioned between the electrodes 116, 118 are three ion exchange membranes, which alternate in the type of ion exchanged. For example, among three membranes, a center membrane 110 may be a cation exchange membrane flanked by second 112 and third 114 anion exchange membranes, as is shown in FIG. 1. However, in other embodiments, the center, first membrane may be an anion exchange membrane and the second and third membranes may be cation exchange membranes. The membranes 110, 112, 114 define chambers, also referred to as channels or reservoirs, in the electrochemical cell 100. As may be seen, a first membrane 110 and a second membrane 112 define a first chamber 106, which in this example is configured as a desalinate chamber that decreases salt concentration in a fluid. The first membrane 110, in combination with a third membrane 114, also defines a second chamber 108, which in this example is configured as a salinate (or concentrate) channel that increases salt/solute concentration in a fluid.

The membranes 110, 112, 114 are ion-selective as well as water-permeable, are insoluble in organic solvents, and are inert (e.g., do not chemically change) in the reaction mixture and/or products. In certain embodiments, the membranes are reinforced with a polymer mesh integrated into the membrane itself and in other embodiments, the membranes are not reinforced. It will be understood that this can be extended to additional membranes, e.g., five or more membranes of alternating type that define respective three or more channels or reservoirs.

A first stream 102 flows through the first chamber 106 of the electrochemical cell 100. The first stream 102 includes at least a solvent (water in this example) and a salt (NaCl in this example, but may include $Na_2SO_4$, $CaCl_2$, KCl, LiCl, and any other ionic salt in the chemistry definition of "a salt") dissolved in the solvent at a first salt concentration (about 35% by weight in this example) when it enters the first chamber 106. A second stream 122 flows through the second chamber 108 of the electrochemical cell 100. The second stream 122 has a second salt concentration (about 35% by weight) as it enters the first chamber. The second salt concentration is the same as the first salt concentration in this example, although it could be different when multiple instances of cell 100 are staged. During an operational mode of the electrochemical cell 100, an electrical potential (e.g., <1.2 V) is applied to the electrodes 116, 118 and the first and second streams 102, 122 are moved (e.g., pumped) through the first and second chambers 106, 108.

When an electrical potential is applied to the electrodes 116, 118, the redox shuttle 117 is oxidized at one electrode 116 and reduced at the other electrode 118, thereby driving salt ions 127 from the first stream 102 in the first chamber 106 into the second stream 122 in the second chamber 108. In particular, the redox shuttle 117 at the first electrode 116 accepts at least one ion 134 from the solution in the first chamber 106. The redox shuttle 117 at the second electrode 118 drives at least one ion 133 into the second stream 122 in the second chamber 108, and the charge is balanced by driving at least one ion 127, of opposite sign of charge to ions 133, 134, from the first stream 102 in the first reservoir 106 across the center membrane 110 into the second stream 122 in the second reservoir 108.

The result of the electrical potential being applied to the electrodes is that the first stream 102 has a reduced concentration of salt (e.g., below a 10% threshold concentration, in some cases below 1%) during the operation mode when exiting the first chamber 106 and the second stream 122 increases in concentration of salt when exiting the second chamber 108. The outputs of the first and second chambers 106, 108 can be further processed by subsequent stages of a similar SUPER cell to achieve similar or increased levels of desalinization and salinization. Such a system may be used with various other salts, such as ionic salts that are soluble in the solvent, e.g., water. Example cations that can be present in the salts include, but are not limited to, hydronium, lithium, sodium, potassium, magnesium, calcium, aluminum, zinc, and iron. Example anions that can be present in the salts include, but are not limited to, chloride, bromide, iodide, halide oxyanions, sulfur oxyanions, phosphorous oxyanions, and nitrogen oxyanions.

Figure 2:
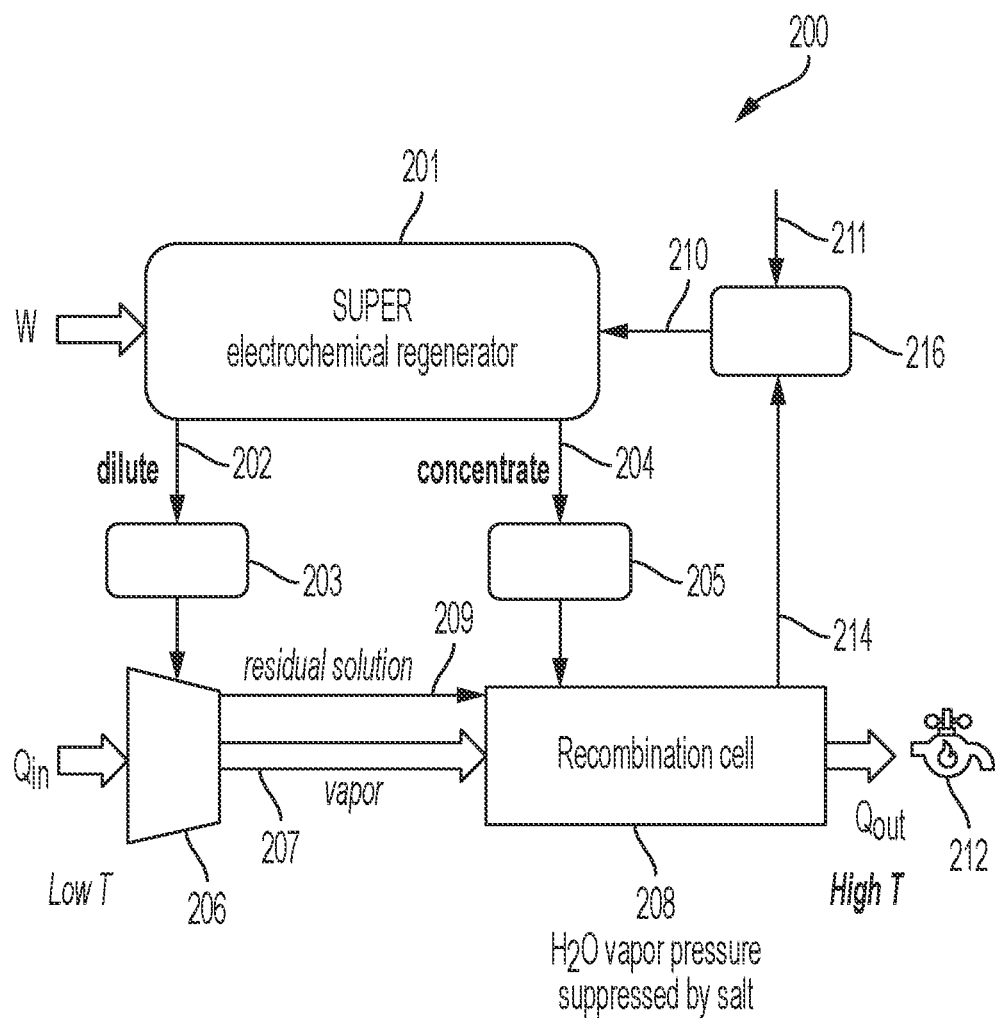
FIG. 2 is a diagram of a heat pump system using vaporization of saline solution according to an example embodiment.

An example embodiment of a SUPER heat pump (SHP) 200 is shown in FIG. 2. The SHP is absorption-based and utilizes one or more SUPER electrochemical regenerator cells 201 driving the SHP by supplying dilute and concentrated salt streams 202, 204 to cold and hot reservoirs 206, 208, respectively. A stream to be regenerated 210 is input to the SUPER cell 201. The water vapor pressure of a salt solution decreases with increasing salt concentration, but it also decreases with temperature. At temperature differences between reservoirs 206 and 208 wherein the former effect (vapor pressure decreases due to increased salt concentration) is larger than the latter (vapor pressure decreases due to decreased temperature), the former effect creates the vapor phase driving force in FIG. 2 from the dilute solution 202 to the concentrated solution 204. Evaporation from the dilute solution 202 in cool reservoir 206 will cool it, absorbing heat flux $Q_{in}$ from the ambient surroundings and creating vapor stream 207 which is fed to the hot reservoir 208. Condensation at the hot reservoir 208 (also referred to as high concentration reservoir or recombination cell), will generate the heat flux $Q_{out}$ that can be used for some heating purpose, such as heating water 212 in a hot water heater. A residual solution 209 is also fed from the cool reservoir 206 to the hot reservoir and includes a concentrated solution that results from the evaporation of the vapor 207.

While FIG. 2 suggests that the residual solution 209 and vapor 207 may be recombined substantially simultaneously in the recombination cell, it may be more effective to combine the concentrate 204 with the vapor 207 first, extract the heat, and then combine the resulting solution with the residual solution 209. The recombined salt solution 214 is returned to the SUPER regenerator cell 201 as all or part of feed stream 210. The regenerator cell 201 will separate the feed stream 210 back into distinct concentrated and dilute streams 204, 202. These separate streams 204, 202 are then recirculated (e.g., dilute stream 202 to the low temperature reservoir 206 and concentrated stream 204 to the recombination cell 208), optionally via storage reservoirs 203, 205. Another storage reservoir 216 may be used to store the recombined salt solution 214 exiting the recombination cell 208. The storage reservoirs 203, 205, 216 can be filled at any time, including times different from when $Q_{out}$ is being generated, providing the capability for load shifting and sharing and for operational optimization. Load shifting means using the electricity to run the regenerator when electricity is less expensive or being generated locally by solar or the like, and not necessarily when the heat pump is pumping heat. Sharing means using the same salt solution for more than one SUPER application. The recombined salt solution 214 may have approximately equal salt concentration as the feed stream 210 that is input to the electrochemical recombination cell 201. The feed stream 210 can be optionally enriched in solutes 211 prior to its introduction into the electrochemical recombination cell 201.

The above-described SHPs will provide increased energy efficiency. For example, they are expected to have a COP (heating) of up to about 6.0, including 6.0, or higher than about 6.0. Thus, full adoption of SHPs for residential water heaters could reduce the 2.8 Quads of primary energy usage by >65% by 2040.

A computational model of the electrochemical regeneration unit operation works with a range of operating conditions applicable to water heating. Using the model, the COP for different heat pump designs can be estimated. Preliminary modeling of a heat pump having the design of FIG. 2 and operating over the standard 68° F. to 125° F. range (water input at 68° F. and output at 125° F.) predicts a COP (heating) of greater than about 6. In addition, SHP has a GWP of zero and does not rely on large pressures, high magnetic or electric fields, or exotic materials that slow the commercialization of other types of non-VC heat pumps.

The above modeling involves LiCl or LiBr aqueous solutions, which are commonly used to suppress water vapor pressure. The temperature range can be extended and the COP further improved by identifying alternative salt and solvent pairs, various membranes, and various system designs.

It is expected that a single-stage SUPER heat pump will heat 30 gallons of water from room temperature to 125° F. with a COP of up to, or greater than about 6. The FIG. 2 system will be operated using common aqueous salt solutions, and the design of FIG. 3A will be integrated with a SUPER system. The systems described herein operate at higher salt concentration than have been used for prior SUPER applications, e.g., higher than 30%, with the least concentrated output stream being >5%. The designs of FIGS. 3A and 3B also may involve the use of surfactants or other means to prevent precipitating solids from clogging electrochemical cells. Accordingly, materials and subsystem characterizations at the expected operating concentrations will be determined using methods developed previously for SUPER applications and extending them as needed.

Existing modeling can evaluate the operational envelope for the heat pump designs. Existing SUPER regenerator designs will be used to develop integrated systems, utilizing absorption HPWH experience. Various candidate materials, including less typical salts, modified solvents, and modified membranes may be used to increase performance of SUPER for a HPWH. Systems and methods are described for removing water from a feed stream using a combination of forward osmosis and electroosmosis, by electrochemically removing solutes (e.g., salt) from the feed stream. The feed stream can be optionally enriched in solutes prior to its introduction into the electrochemical salt removal system.

Figure 3:
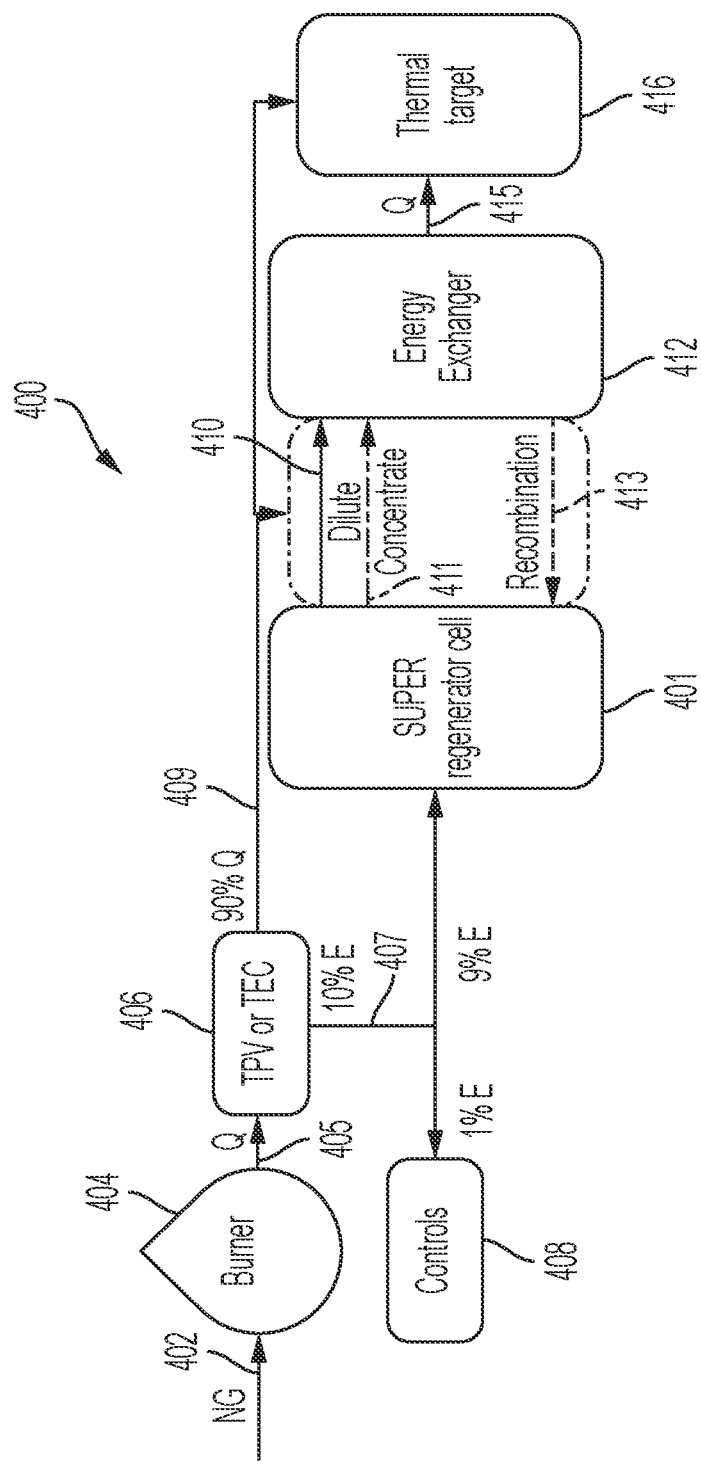
FIG. 3 is a diagram of a system according to another example embodiment.

In FIG. 3, a diagram shows a combined cycle heat pump system 400 usable for heating using a SUPER cell 401 according to an example embodiment. A fuel 402 is fed to a burner 404 which outputs heat 405. The fuel 402 is shown here as natural gas, but could include any type of combustible fuel, such as propane, butane, methane, heating oil, wood (e.g., wood pellets), hydrogen gas, etc. A high-temperature, thermal-electric conversion (TEC) unit 406 produces electricity 407 and high temperature waste heat 409. The TEC unit 406 may be include a solid-state heat-toelectrical converter such as a thermovoltaic (TPV) cell that converts heat to electricity analogously to a photovoltaic cell that converts light to electricity.

The high-temperature waste heat 409 is fed to a SHP system, which includes the SUPER cell 401, an energy/heat exchangers 412, various fluid flows/reservoirs, including a dilute stream/reservoir 410, a concentrate stream/reservoir 411, and a recombination stream/reservoir 413. The high-temperature waste heat 409 can be used as final heating together with SHP system output 415 of a target material 416. The high-temperature waste heat 409 can also be used for purpose such as distillation, heating a reservoir to cause evaporation of vapor (see, e.g., reservoir 206 in FIG. 2), etc. The electricity 407 runs the SUPER regenerator 401 and controls 408 to create specific benefits (heat pumping, salt separation, etc.)

A natural gas-fired super can have a COP approaching 2.5. Various estimates of performance of such as system are shown in Table 1 below, in which COP is estimated as 2.35. This system can be applicable for processes which can use SUPER regeneration and heating, and operates as a pure heat pump, e.g., does not need to be connected to an electrical grid.

TABLE 1

| Component | % Energy | Component COP | Partial COP |
|---|---|---|---|
| Adsorption heat pump | 90% | 1.5 | 1.35 |
| Controls | 1% | 0 | 0 |
| Super cell | 9% | 10 | 1 |

Figure 4:
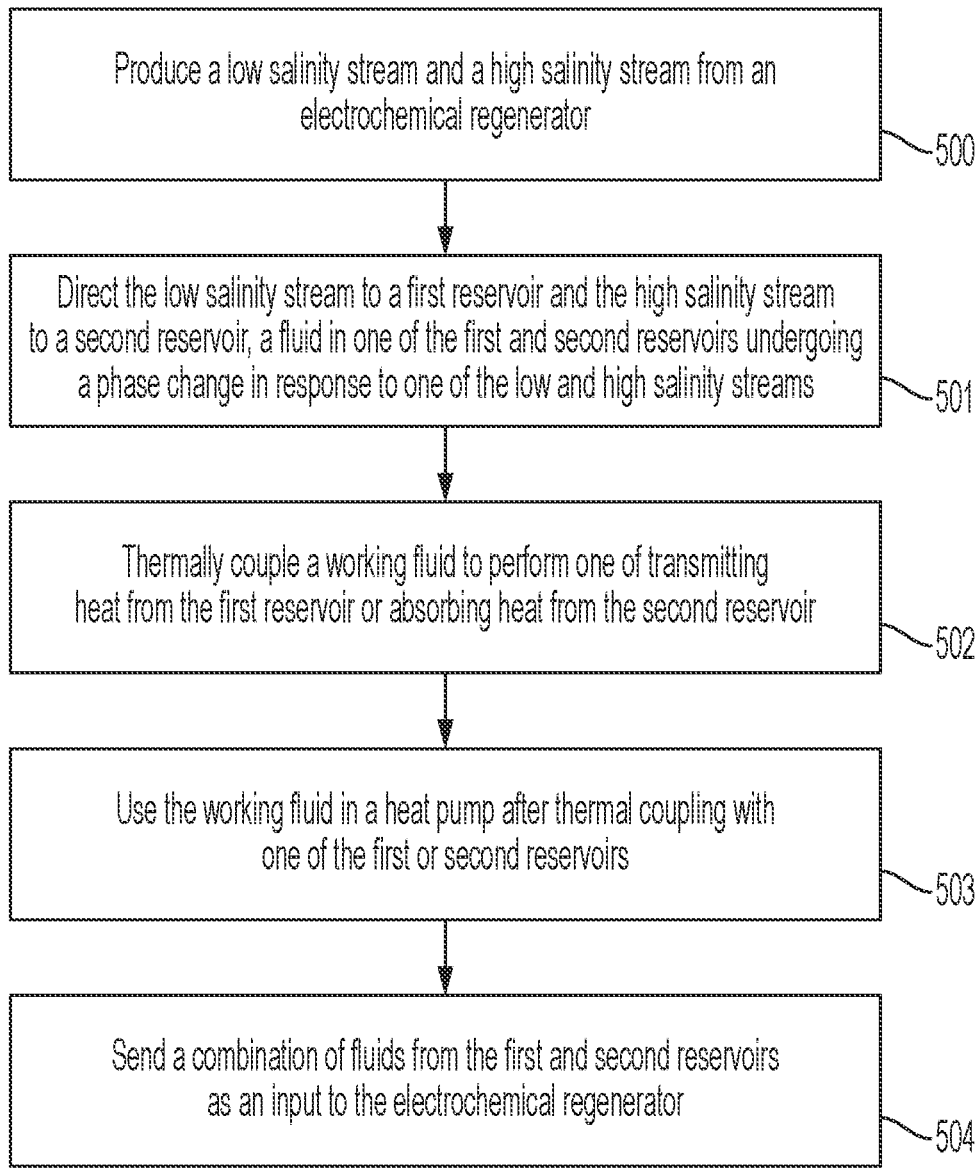
FIGS. 4 and 5 are a flow diagrams of methods in accordance with certain embodiments.

In FIG. 4, a flowchart shows a method according to an example embodiment. The method involves producing 500 a low salinity stream and a high salinity stream from an electrochemical regenerator. In block 501, the low salinity stream is directed to a first reservoir and the high salinity stream is directed to a second reservoir. A fluid in one of the first and second reservoirs undergoes a phase change in response to one of the low and high salinity streams. The system performs 502 one of transmitting heat from the first reservoir or absorbing heat from the second reservoir. A combination of fluids from the first and second reservoirs is sent 504 as an input to the electrochemical regenerator.

Figure 5:
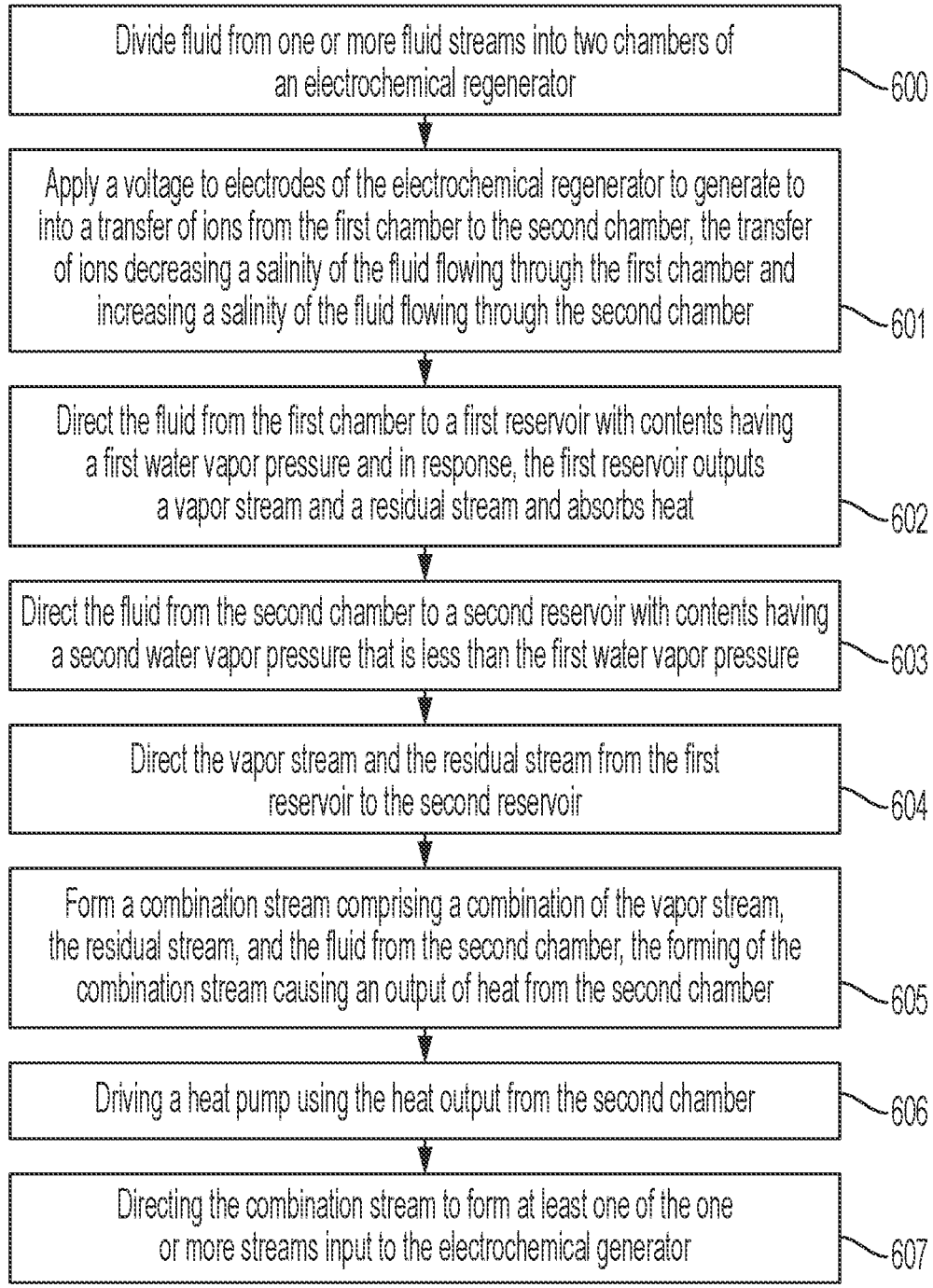

In FIG. 5, a flowchart shows a method according to another example embodiment. The method involves dividing 600 fluid from one or more fluid streams into two chambers of an electrochemical regenerator. A voltage is applied 601 to electrodes of the electrochemical regenerator to generate transfer of ions from the first chamber to the second chamber. The transfer of ions decreasing a salinity of the fluid flowing through the first chamber and increasing a salinity of the fluid flowing through the second chamber. The fluid from the first chamber is directed 602 to a first reservoir with contents having a first water vapor pressure and, in response, the reservoir outputs a vapor stream and a residual stream and absorbs a first heat flow.

The fluid from the second chamber is directed 603 to a second reservoir with contents having a second water vapor pressure that is less than the first water vapor pressure. The vapor stream and the residual stream are directed 604 from the first reservoir to the second reservoir. A combination stream is formed 605 that includes a combination of the vapor stream, the residual stream, and the fluid from the second chamber. The condensing of the vapor stream in the second reservoir causes an output of a second heat flow from the second reservoir. A heat pump is driven 606 using the second heat flux output from the second reservoir. The combination stream is directed 607 to form at least one of the one or more streams input to the electrochemical generator.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g., 1 to 5 includes 1, 1.5, 2, 2.75, 3, 3.80, 4, and 5) and any range within that range. All descriptions of solute concentrations by percentage are meant to imply percentage by weight unless otherwise indicated.

The foregoing description has been presented for the purposes of illustration and description. It is not intended to be exhaustive or to limit the embodiments to the precise form disclosed. Many modifications and variations are possible in light of the above teachings. Any or all features of the disclosed embodiments can be applied individually or in any combination and are not meant to be limiting, but purely illustrative. It is intended that the scope of the invention be limited not with this detailed description, but rather, determined by the claims appended hereto.

What is claimed is:

1. A system comprising:
an electrochemical regenerator configured to receive a first solution having a first salt concentration and to output a second solution having a second salt concentration lower than the first salt concentration and a third solution having a third salt concentration higher than the first salt concentration;
a first reservoir with first contents having a first water vapor pressure and configured to receive the second solution and output a vapor stream and a residual stream, the first reservoir absorbing a first heat flux;
a second reservoir with second contents having a second water vapor pressure that is less than the first water vapor pressure and coupled to the first reservoir, wherein the second reservoir is configured to receive the third solution and the vapor stream from the first reservoir to generate a second heat flux that is output from the second reservoir, a recombined solution comprising contents of the second reservoir and the residual stream being recirculated to the electrochemical regenerator; and
a secondary heat pump with a working fluid that is cooled by the first heat flux.

2. A system comprising:
an electrochemical regenerator configured to receive a first solution having a first salt concentration and to output a second solution having a second salt concentration lower than the first salt concentration and a third solution having a third salt concentration higher than the first salt concentration;
a first reservoir with first contents having a first water vapor pressure and configured to receive the second solution and output a vapor stream and a residual stream, the first reservoir absorbing a first heat flux;
a second reservoir with second contents having a second water vapor pressure that is less than the first water vapor pressure and coupled to the first reservoir, wherein the second reservoir is configured to receive the third solution and the vapor stream from the first reservoir to generate a second heat flux that is output from the second reservoir, a recombined solution comprising contents of the second reservoir and the residual stream being recirculated to the electrochemical regenerator; and a thermal target that is heated by the second heat flux.

3. The system of claim 2, wherein the thermal target comprises a secondary heat pump with a working fluid that is heated by the second heat flux.

4. The system of claim 2, wherein the third solution is combined with the vapor stream in a first stage of the second reservoir and contents of the first stage are combined with the residual stream in a second, separate stage of the second reservoir.

5. The system of claim 2, wherein the thermal target comprises a water heater.

6. The system of claim 2, wherein a fourth salt concentration of the recombined solution is approximately equal to the first salt concentration.

7. The system of claim 2, wherein the second salt concentration is above 5% by weight.

8. The system of claim 2, further comprising one or more storage reservoirs to hold respective one or more of the first solution, the second solution, the third solution, and the recombined solution.

9. The system of claim 8, wherein the one or more storage reservoirs are used for load shifting and sharing between two or more of the electrochemical regenerator, the first reservoir, and the second reservoir.

10. The system of claim 2, further comprising:
a burner that converts a combustible fuel to heat; and
a solid-state heat-to-electricity converter that converts a first portion of the heat to electricity that powers the electrochemical regenerator, a second portion of the heat being high-temperature waste heat that is combined with the second heat flux at the thermal target.

11. The system of claim 10, wherein the high-temperature waste heat is coupled to heat the first reservoir to cause evaporation of the vapor stream.

12. A method comprising:
producing a low salinity solution and a high salinity solution from an electrochemical regenerator;
directing the low salinity solution to a first reservoir with first contents having a first water vapor pressure, the first reservoir outputting a vapor stream and a residual stream and absorbing a first heat flux;
directing the high salinity solution and the vapor stream to a second reservoir having a second water vapor pressure that is less than the first water vapor pressure, the second reservoir outputting a second heat flux and a recombined solution, the recombined solution comprising contents of the second reservoir and the vapor stream; and
using one or both of the first heat flux and the second heat flux as a respective heat sink and heat source in a heat pump system.

13. The method of claim 12, further comprising performing one of cooling or heating of a working fluid of a heat pump respectively by the first heat flux or the second heat flux.

14. The method of claim 12, further comprising:
storing one or more of the low salinity solution, the high salinity solution, and the recombined solution in one or more respective storage reservoirs; and
using the one or more storage reservoirs for load shifting and sharing between two or more of the electrochemical regenerator, the first reservoir, and the second reservoir.

15. The method of claim 12, further comprising:
converting a combustible fuel to heat;
converting a first portion of the heat to electricity via a solid state converter that is used to power the electrochemical regenerator; and
performing at least one of combining a second portion of the heat with the second heat flux and heating the first reservoir with the second portion of the heat to cause evaporation of the vapor stream.

16. The method of claim 12, further comprising:
combining the high salinity solution with the vapor stream in a first stage of the second reservoir; and
combining contents of the first stage with the residual stream in a second, separate stage of the second reservoir.

17. The method of claim 12, wherein the low salinity solution has a salt concentration above 5% by weight.

* * * * *